United States Patent [19]
McEachern et al.

[11] Patent Number: 5,581,471
[45] Date of Patent: Dec. 3, 1996

[54] METHOD AND APPARATUS FOR STORING ELECTRIC POWER MEASUREMENTS

[76] Inventors: Alexander McEachern, 6067 Rockridge Blvd., Oakland, Calif. 94618; Richard Piehl, 51 Winterrun Dr., San Ramon, Calif. 94583

[21] Appl. No.: 224,026

[22] Filed: Apr. 8, 1994

[51] Int. Cl.[6] .................................................. G01R 1/00
[52] U.S. Cl. .......................... 364/483; 364/552; 364/569; 361/96; 361/103
[58] Field of Search ................................... 364/483, 557, 364/569, 371.03; 361/93–98, 103; 324/141, 142; 369/53, 58

[56] References Cited

U.S. PATENT DOCUMENTS

| | | | |
|---|---|---|---|
| 4,361,273 | 11/1982 | Krass | 236/11 |
| 4,583,936 | 4/1986 | Krieger | 236/15 |
| 4,591,782 | 5/1986 | Germer | 324/103 R |
| 4,758,962 | 7/1988 | Fernandes | 364/483 |
| 4,783,748 | 11/1988 | Swarztrauber et al. | 364/483 |
| 4,817,705 | 4/1989 | Levine et al. | 165/12 |
| 5,212,441 | 5/1993 | McEachern et al. | 324/142 |
| 5,233,538 | 8/1993 | Wallis | 364/483 |
| 5,287,292 | 2/1994 | Kenny et al. | 364/550 |
| 5,422,832 | 1/1995 | Moyal | 364/557 |
| 5,481,468 | 8/1996 | Mceachern | 364/481 |

OTHER PUBLICATIONS

Cox et al. "VLSI performance compensation for off–chip drivers and clock generation"; IEEE 1989 Custom Integrated Circuits Conference.

Primary Examiner—James P. Trammell
Assistant Examiner—Kamini S. Shah
Attorney, Agent, or Firm—Haverstock & Associates

[57] ABSTRACT

An electronic instrument that records electric power measurements. The instrument contains two types of memories: the first type of memory can tolerate wide fluctuations in ambient temperature but is expensive per unit of storage capacity, and the second type of memory only operates in a narrow ambient temperature range but is inexpensive per unit of storage capacity. For example, the two types of memory may be static Random Access Memory (RAM) and a hard disk drive, respectively. The instrument contains more storage capacity of the second type than storage capacity of the first type. The instrument records all of its measurements in the first type of memory. It also monitors the ambient temperature. When it detects an ambient temperature that will permit the second type of memory to function properly, it flushes the first type of memory into the second type of memory, thus creating space for recording subsequent data in the first type of memory. The instrument contains sufficient memory of the first type to allow it to record at least twenty-four hours of data without employing the memory of the second type; consequently, as long as the ambient temperature passes through the acceptable range for the memory of the second type at least once during a day/night cycle, the instrument is able to record power measurements until the second type of memory is full.

20 Claims, 3 Drawing Sheets

METHOD AND APPARATUS FOR STORING ELECTRIC POWER MEASUREMENTS

FIELD OF THE INVENTION

The present invention pertains to electronic apparatus for measuring and recording electric power parameters. More specifically, this invention pertains to an electric power recording instrument that can inexpensively store a large number of power measurements while operating over a wide range.

BACKGROUND OF THE INVENTION

Instruments for recording electric power parameters are well known. These instruments typically record power parameters such as volts, amps, or watts, as a function of time. Traditionally, the recording medium was a strip of paper that advanced steadily as the instrument drew a line representative of the parameter's value. In more modern instruments, the measured parameters are converted to digital values which are subsequently stored in digital memories for later extraction, analysis, communication, or presentation.

There are two types of digital memory commonly used for this purpose: semiconductor RAM (random access memory) and disk drives.

Semiconductor RAM has the advantage of operating over a wide temperature range. For example, the TMS4C1024 RAM, available from Texas Instruments of Houston, Tex. is specified for operating between 0 degrees centigrade and 70 degrees centigrade, and for storage between +65 degrees centigrade and +150 degrees centigrade.

Disk drives operate over a much narrower temperature range. For example, the Model GO12A 120 Megabyte Hard Disk Drive available from Quantum Corporation in Milpitas, Calif. is specified to operate only from 5 degrees centigrade to 55 degrees centigrade, although it may be stored at temperatures from −40 degrees centigrade to +70 degrees centigrade. Most electronic devices operate over a wider temperature range than disk drives; consequently, if an electronic instrument incorporates a disk drive, it is common for the disk drive operating temperature specifications to determine the operating temperature specifications of the instrument as a whole.

Disk drives have the advantage of being more than an order of magnitude less expensive than semiconductor RAM per kilobyte of storage.

Instruments that record power parameters often consume sufficient electric power to make operating at low outside temperatures fairly easy; the power consumed by the instrument raises its temperature, and some instruments even incorporate a small heater. For this reason, operation at low outside temperatures is not normally a problem for electric power recording instruments.

However, at high outside temperatures it is difficult to inexpensively and reliably cool the instrument. For example, for power-pole mounted instruments, ambient outside temperatures of 40 degrees centigrade are common. Heat rise from direct solar incidence on the instrument enclosure commonly contributes an additional 10 degrees centigrade or more, and internal power dissipation in the instrument commonly contributes another additional 15 degrees centigrade or more. Internal operating temperature therefore commonly reaches 65 degrees centigrade. This temperature is higher than temperatures at which disk drives can commonly operate. Consequently, in prior art in power recording instruments designed to reliably operate outdoors, expensive semiconductor RAM memories must be used instead of disk drives.

SUMMARY OF THE INVENTION

The present invention describes an electronic instrument that records electric power measurements. The instrument contains two types of memories: the first type of memory can tolerate wide fluctuations in ambient temperature but is expensive per unit of storage capacity, and the second type of memory only operates in a narrow ambient temperature range but is inexpensive per unit of storage capacity. For example, the two types of memory may be static Random Access Memory (RAM) and a hard disk drive, respectively. The instrument contains more storage capacity of the second type than storage capacity of the first type. The instrument records all of its measurements in the first type of memory. It also monitors the ambient temperature. When it detects an ambient temperature that will permit the second type of memory to function properly, it flushes the first type of memory into the second type of memory, thus creating space for recording subsequent data in the first type of memory. The instrument contains sufficient memory of the first type to allow it to record data over a predetermined interval (typically twenty-four hours) without employing the memory of the second type; consequently, as long as the ambient temperature passes through the acceptable range for the memory of the second type at least once during a day/night cycle, the instrument is able to record power measurements until the second type of memory is full.

It is an object of the present invention to employ disk drive memory in an electric power recording instrument in such a way that the recording instrument is able to operate in an environment that often exceeds the acceptable temperature range of the disk drive.

According to the present invention, the recording instrument incorporates sufficient semiconductor RAM memory to store electric power parameters recorded over some period of time, typically twenty-four hours. The recording instrument also incorporates a disk drive memory with sufficient capacity to store electric power parameters recorded over a substantially longer period of time. There are other ways to perform this function other than by increasing the size of the data store. In the preferred embodiment, the recording instrument also incorporates a microprocessor, a temperature sensor that can be examined by the microprocessor, and a disk power switch controlled by the microprocessor.

The microprocessor causes the power parameters to be stored in the semiconductor RAM. The microprocessor also periodically examines the temperature sensor. If the microprocessor determines during the periodic examination that the present temperature is within the disk drive's operating temperature limits, it turns on the disk power switch and flushes the contents of the RAM into the disk drive.

As long as the instrument's operating temperature passes through the disk drive's operating temperature prior to the RAM filling completely, the recording instrument's memory storage limit will be determined by the disk drive, not the RAM.

In this way the operating temperature limits of the recording instrument are determined by the wide operating temperature limits of a relatively small amount of RAM, while the memory storage limits are determined by a disk drive

DETAILED DESCRIPTION OF A PREFERRED EMBODIMENT

Figure 1:
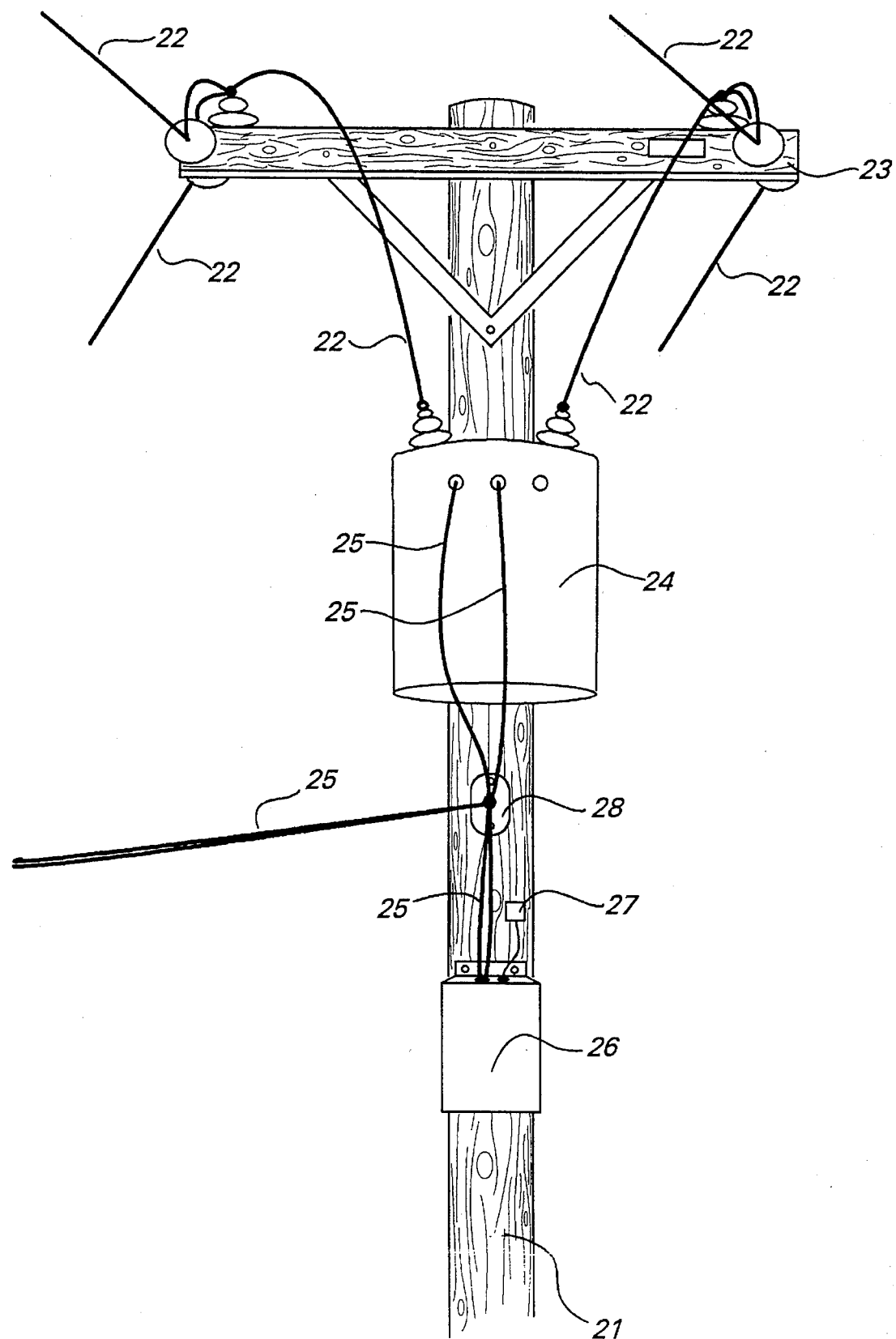
FIG. 1 is a perspective view of a power recording instrument mounted on a power pole.
Figure 2:
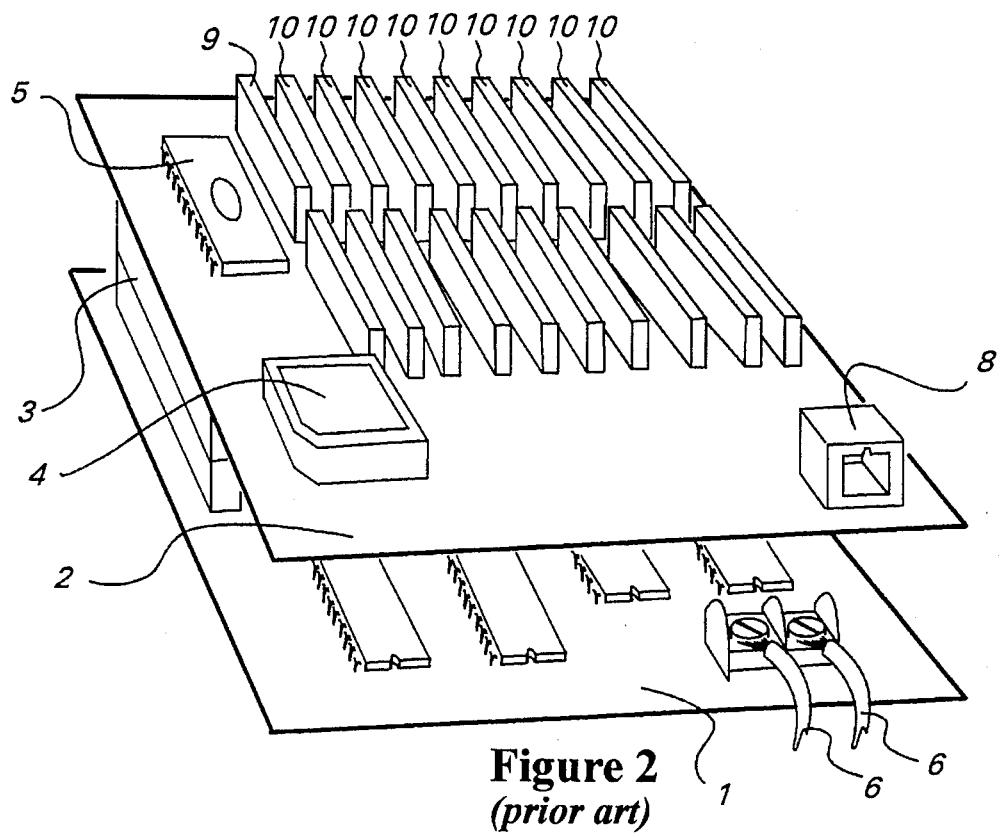
FIG. 2 is a perspective view of the circuit boards in a prior art implementation of a power recording instrument.
Figure 3:
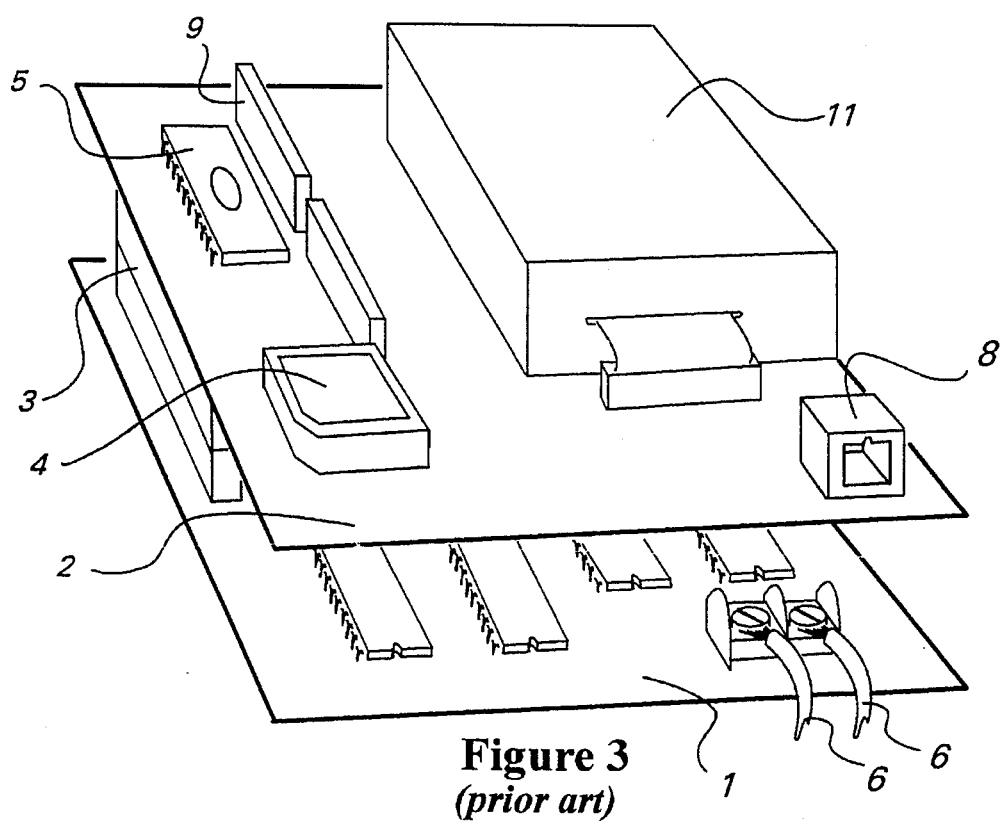
FIG. 3 is a perspective view of the circuit boards in an alternative prior art implementation of a power recording instrument.
Figure 4:
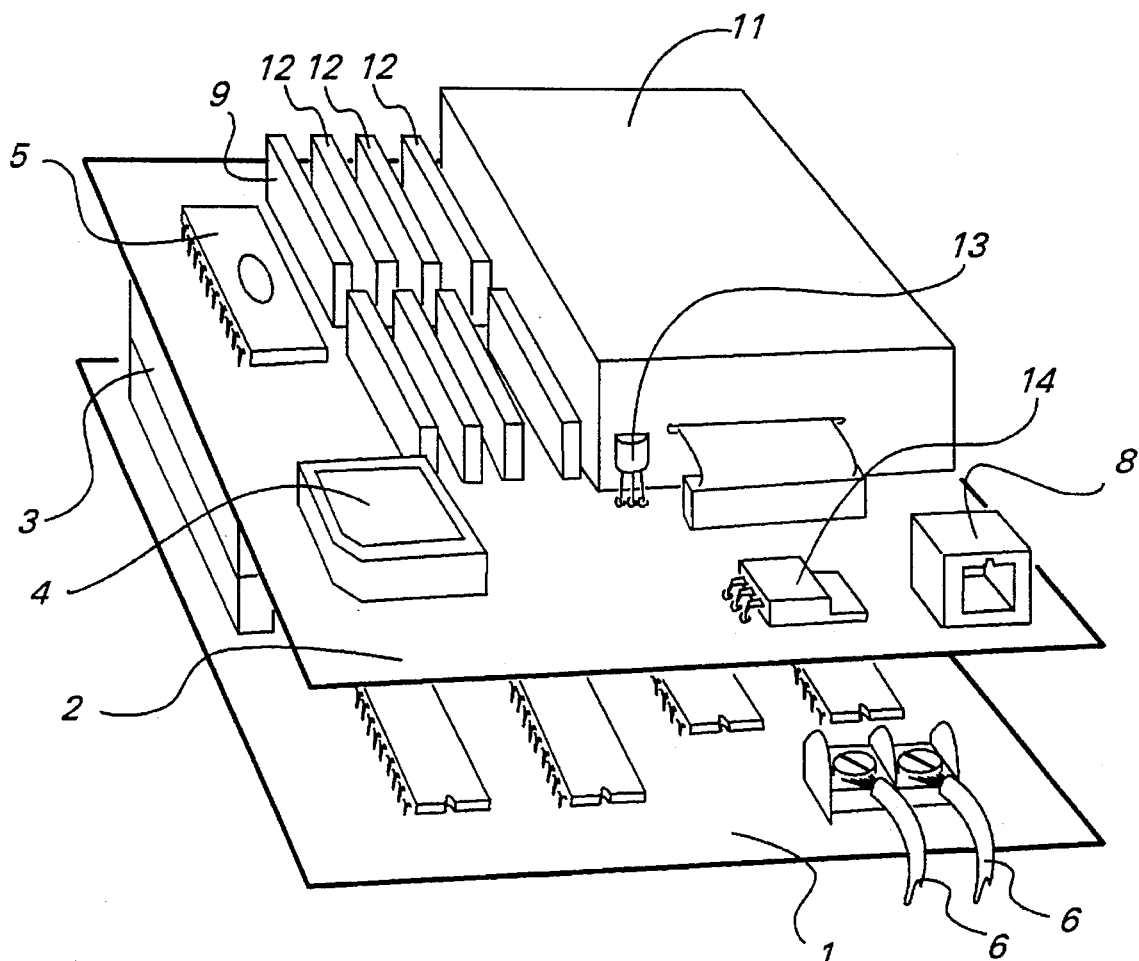
FIG. 4 is a perspective view of the circuit boards of the present invention.

Referring to FIG. 1, we see an electronic power recording instrument 26, more fully described in FIGS. 2, 3, and 4, mounted on a power pole 21. We see medium voltage conductors 22, typically rated at 12,500 volts, attached to crossbeam 23. The medium voltage conductors 22 deliver power to the primary of transformer 24. The end-use conductors 25, typically rated at 120 volts or 240 volts, are connected to the secondary of transformer 24. After passing through a mechanical strain relief 28, the end-use conductors 25 deliver power to a consumer and to the electronic power recording instrument 26. The electronic power recording instrument 26 may report its measurement results through a telephone connection 27, or through some other means such as radio transmission, optical transmission, or direct connection to a computer.

Turning now to FIG. 2, we see two prior art circuit boards 1,2 that would be contained within the electronic power recording instrument 26 of FIG. 1. One prior-art instrument that operates according to the process described in FIG. 2 is the PQ Node, manufactured by Basic Measuring Instruments of Santa Clara, Calif. The electric power to be measured is brought to the lower circuit board 1 on conductors 6. The lower circuit board 1 converts the electric power signals to digital values which are passed through a connector 3 to the upper circuit board 2. This circuit board 2 contains a microprocessor 4 and an electrically programmable read-only memory (EPROM) 5 that stores the program for the microprocessor 4. This circuit board 2 also contains RAM 9, 10 used for two purposes. One part of the RAM 9 is used for necessary software housekeeping, including stacks and temporary variables. A larger part of the RAM 10 is used by the microprocessor 4 for storing recorded power parameters. A connector 8 allows the microprocessor 4 to communicate the recorded data stored in RAM 10.

Turning now to FIG. 3, we see an alternate prior art implementation of circuit boards 1,2 that would be contained within the electronic power recording instrument 26 of FIG. 1. One prior-art instrument that operates according to the process described in FIG. 3 is the Omega Power Analysis System, manufactured by Reliable Power Monitors of Los Gatos, Calif. The implementation is identical to that shown in FIG. 2, except that a disk drive 11 has been substituted for the RAM 10 of FIG. 2. The approach in FIG. 3 can be used to both increase the amount of storage memory and lower its cost when compared with the approach in FIG. 2; however, the operating temperature range of the prior art shown in FIG. 3 is much narrower than the operating temperature range of the prior art shown in FIG. 2.

Turning now to FIG. 4, we see the preferred embodiment of the present invention which incorporates all of the features shown in FIG. 3 and adds additional RAM 12, a temperature sensor 13, and a microprocessor-controlled power switch 14. The invention functions as follows.

The microprocessor 4 stores digital representations of electric power parameters in semiconductor RAM 12. The microprocessor 4 also periodically examines the temperature sensor 13, which can be any electronic temperature measuring device such as the LM335A available from National Semiconductor of Santa Clara, Calif. The temperature sensor 13 allows the microprocessor 4 to determine the present operating temperature of the disk drive 11.

If the microprocessor determines that the operating temperature is within the acceptable range for the disk drive 11, the microprocessor turns on switch 14, which in turn delivers power to the disk drive 11, and copies the stored data in semiconductor RAM 12 into the disk drive 11, then clears the data from semiconductor RAM 12. Switch 14 may be any microprocessor controlled power switch, such as the BUZ11A FET available from Motorola Semiconductor of Phoenix, Ariz.

If the microprocessor 4 determines that the operating temperature is outside the acceptable range for the disk drive 11, the microprocessor 4 continues to store its data in semiconductor RAM 12, while periodically examining the temperature sensor 13.

It will be apparent that if there is sufficient semiconductor RAM 12 to store the power parameters recorded over an interval (typically twenty-four hours) that includes some shorter interval during which the disk drive operating temperature specifications are met, the invention of FIG. 4 combines the operating temperature range of the prior art shown in FIG. 2 with the storage capacity of the prior art shown in FIG. 3.

If the device is to be operated in an environment that is anticipated to be outside the acceptable temperature range for long periods of time, the inventors envision at least two methods of ensuring adequate operation. First, the amount of semiconductor memory can be increased to provide sufficient storage for the anticipated duration of operation outside the acceptable temperature range. Second, the system can incorporate any of several data compression techniques for storing large amounts of data within a smaller data storage media. See for example, the co-owned U.S. patent application Ser. No. 925,570 filed Aug. 4, 1992, entitled "METHOD AND APPARATUS FOR STORING AN INCREASING NUMBER OF SEQUENTIAL SAMPLES IN A FIXED AMOUNT OF MEMORY." Similarly, the apparatus can be configured to discard data having less intrinsic value as identified by some programmed algorithm to provide additional storage space.

Various substitutions can be made in the preferred embodiment without departing from the scope and spirit of the invention as defined by the appended claims. The substitutions include, but are not limited to, incorporating the temperature sensor 13 in the disk drive 11; employing other types of semiconductor memories 12 including but not limited to static RAM, dynamic RAM, and flash-programmable semiconductor memory.

We claim:

1. An apparatus for measuring and storing electric power parameters, comprising:

a. means for measuring electric power parameters;

b. means for convening the electric power parameters to a stream of digital values;

c. a first digital memory having a first predetermined finite size and coupled for storing the stream of digital values to form a plurality of stored values, wherein the first digital memory has a first maximum operating temperature specification;

d. a second digital memory having a second predetermined finite size and coupled for storing the stored values, wherein the second finite size is larger than the first finite size, and further wherein the second digital memory has a second maximum operating temperature specification that is lower than the first maximum operating temperature specification;

e. means for sensing temperature coupled to the apparatus; and f. means for transferring the stored values from the first digital memory to the second digital memory when the sensed temperature is less than the second maximum operating temperature specification.

2. The apparatus for measuring and storing electric power parameters according to claim 1, wherein the means for sensing temperature measures a temperature of the apparatus.

3. The apparatus for measuring and storing electric power parameters according to claim 1, wherein the means for sensing temperature measure a temperature of the second digital memory.

4. The apparatus for measuring and storing electric power parameters according to claim 1, wherein the means for sensing temperature measures a temperature of an environment.

5. The apparatus for measuring and storing electric power parameters according to claim 1, wherein the first digital memory comprises semiconductor Random Access Memory.

6. The apparatus for measuring and storing electric power parameters according to claim 1, wherein the second digital memory comprises a hard disk drive.

7. The apparatus for measuring and storing electric power parameters according to claim 1, further comprising means for compressing the stored values.

8. The apparatus according to claim 1, wherein the second digital memory further comprises a minimum operating temperature specification, the apparatus further comprising a heater for heating the second digital memory in the event that the operating temperature is less than the minimum operating temperature specification.

9. The apparatus according to claim 1, wherein the first digital memory device comprises flash-programmable semiconductor memory.

10. The apparatus according to claim 1, wherein means for sensing temperature is located inside a housing for the second digital memory.

11. An apparatus for measuring and storing electric power parameters, comprising;

a. a circuit for measuring electric power signals for forming measurement signals;

b. a circuit for converting the measurement signals to a stream of digital values;

c. a microprocessor coupled to the circuit for receiving the digital values;

d. a first digital memory coupled to the microprocessor for storing the digital values to form stored values;

e. a second digital memory coupled to the microprocessor for storing the stored values;

f. a temperature measuring device coupled to the microprocessor for measuring a temperature of the second digital memory; and g. means for transferring the stored values from the first digital memory to the second digital memory when the temperature of the second digital memory is within a predetermined range.

12. The apparatus according to claim 11, further comprising a switch coupled for control to the microprocessor for turning on and off the second digital memory.

13. The apparatus according to claim 11, wherein the first digital memory comprises semiconductor Random Access Memory.

14. The apparatus according to claim 11, wherein the first digital memory device comprises flash-programmable semiconductor memory.

15. The apparatus according to claim 11, wherein the temperature measuring device is located inside a housing for the second digital memory.

16. The apparatus according to claim 11, wherein the second digital memory means comprises a hard disk drive.

17. The apparatus according to claim 11, wherein the second digital memory further comprises a minimum operating temperature specification, the apparatus further comprising a heater for heating the second digital memory in the event that the operating temperature is less than the minimum operating temperature specification.

18. A method of storing electric power parameters comprising the steps of:

a. measuring electric power parameters;

b. converting the electric power parameters to a stream of digital values;

c. storing the digital values in a first digital memory having a first predetermined finite size forming a plurality of stored values, wherein the first digital memory has a first maximum operating temperature specification;

d. sensing a temperature representative of an operating temperature of the second memory; and e. transferring the stored values from the first digital memory to a second digital memory having a second predetermined finite size and a second maximum operating temperature specification that is lower than the first maximum operating temperature, such transfer occurring when the sensed temperature is less than the second maximum operating temperature specification.

19. The method according to claim 18, further comprising the step of compressing the stored values.

20. The method according to claim 18 further comprising the step of heating the second digital memory in the event that the sensed temperature is less than a minimum operating temperature specification.

\* \* \* \* \*

UNITED STATES PATENT AND TRADEMARK OFFICE
CERTIFICATE OF CORRECTION

PATENT NO. : 5,581,471
DATED : December 3, 1996
INVENTOR(S) : McEachern et al.

It is certified that error appears in the above-identified patent and that said Letters Patent is hereby corrected as shown below:

In column 1, line 32, "between +65 degrees" should have been typed --between -65 degrees--.

In column 4, line 66, "convening" should have been typed --converting--.

In column 5, line 51, "wherein means" should have been typed --wherein the means--.

On the cover sheet, in box 22, "Filed: Apr. 8, 1994" should have been typed --Filed: Apr. 7, 1994--.

Signed and Sealed this

First Day of April, 1997

Attest:

BRUCE LEHMAN

*Attesting Officer*  *Commissioner of Patents and Trademarks*